(12) United States Patent
Lee et al.

(10) Patent No.: US 9,209,253 B2
(45) Date of Patent: Dec. 8, 2015

(54) NITRIDE BASED SEMICONDUCTOR DEVICE AND MANUFACTURING METHOD THEREOF

(71) Applicant: Samsung Electronics Co., Ltd., Suwon-si, Gyeonggi-do (KR)

(72) Inventors: Jae Hoon Lee, Suwon-si (KR); Ki Se Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 5 days.

(21) Appl. No.: 13/728,157

(22) Filed: Dec. 27, 2012

(65) Prior Publication Data
US 2013/0168688 A1     Jul. 4, 2013

(30) Foreign Application Priority Data
Dec. 30, 2011   (KR) .................. 10-2011-0147129

(51) Int. Cl.
*H01L 29/15*   (2006.01)
*H01L 29/20*   (2006.01)
(Continued)

(52) U.S. Cl.
CPC ...... *H01L 29/2003* (2013.01); *H01L 21/02107* (2013.01); *H01L 29/0649* (2013.01); *H01L 29/66212* (2013.01); *H01L 29/872* (2013.01);
(Continued)

(58) Field of Classification Search
CPC .............. H01L 29/2003; H01L 29/872; H01L 21/8252; H01L 29/66143; H01L 21/02458; H01L 21/0254; H01L 21/36; H01L 27/0814; H01L 27/1225; H01L 29/475; H01L 29/66212; H01L 29/20; H01L 21/02381; H01L 21/02505; H01L 21/02389; H01L 33/0075; H01L 39/2416; H01L 21/3143; H01L 31/03048; H01L 31/1856; H01L 21/28581; H01L 29/66174
USPC ............... 257/79–103, 69, 13, 458, 314, 350, 257/723, 190; 438/22, 30, 59, 24, 27, 928, 438/71, 382, 488
See application file for complete search history.

(56) References Cited

U.S. PATENT DOCUMENTS

2006/0118803 A1* 6/2006 Lee et al. .................. 257/98
2008/0311694 A1* 12/2008 Kawasaki et al. .......... 438/31
(Continued)

FOREIGN PATENT DOCUMENTS

JP    2005-097040    4/2005
JP    2005-327912    11/2005
(Continued)

*Primary Examiner* — Su C Kim
*Assistant Examiner* — Junaiden Mirsalahuddin
(74) *Attorney, Agent, or Firm* — Lee & Morse, P.C.

(57) ABSTRACT

A nitride based semiconductor device includes a first metallic junction layer, a Schottky junction layer on the first metallic junction layer, a first group III nitride semiconductor layer on the Schottky junction layer, a first insulating pattern layer on the first group III nitride semiconductor layer, the first insulating layer pattern including curved protrusions, a second group III nitride semiconductor layer laterally grown on the first group III nitride semiconductor layer, a first type group III nitride semiconductor layer on the second group III nitride semiconductor layer, the first type group III nitride semiconductor layer being simultaneously doped with aluminum (Al) and silicon (Si), an ohmic junction layer formed on the first type group III nitride semiconductor layer, a second metallic junction layer on the ohmic junction layer, and a metallic supporting substrate on the second metallic junction layer.

6 Claims, 16 Drawing Sheets

(51) Int. Cl.
  *H01L 21/02* (2006.01)
  *H01L 29/66* (2006.01)
  *H01L 29/872* (2006.01)
  *H01L 29/06* (2006.01)

(52) U.S. Cl.
  CPC ......... *H01L 21/0242* (2013.01); *H01L 21/0254* (2013.01); *H01L 21/0262* (2013.01); *H01L 21/02458* (2013.01); *H01L 21/02494* (2013.01); *H01L 21/02505* (2013.01); *H01L 21/02639* (2013.01); *H01L 21/02647* (2013.01)

(56) References Cited

U.S. PATENT DOCUMENTS

| | | | |
|---|---|---|---|
| 2010/0117115 A1* | 5/2010 | Tanaka et al. | 257/103 |
| 2011/0278628 A1* | 11/2011 | Lee | 257/98 |
| 2013/0119394 A1* | 5/2013 | Zhu et al. | 257/76 |

FOREIGN PATENT DOCUMENTS

| | | |
|---|---|---|
| JP | 2008-205296 | 9/2008 |
| KR | 10-2005-0064527 A | 6/2005 |

* cited by examiner

NITRIDE BASED SEMICONDUCTOR DEVICE AND MANUFACTURING METHOD THEREOF

CROSS-REFERENCE TO RELATED APPLICATION

This application claims the benefit under 35 U.S.C. §119 of Korean Patent Application No. 10-2011-0147129, filed on Dec. 30, 2011, in the Korean Intellectual Property Office, the disclosure of which is incorporated herein by reference.

BACKGROUND

1. Field

Embodiments relate to a nitride based semiconductor device and a manufacturing method thereof

2. Description of the Related Art

A semiconductor device, for example, a Schottky diode, is used for various electronic devices, for example, a super-high speed information communication system, a switch, a power supply, a power converter, and the like. For efficient operation, the semiconductor device uses a low on-state voltage, a low reverse leakage current, a high reverse bias voltage blocking capability, a high switching speed, and a high speed/high power.

Recently, in an effort to reduce energy loss, research and development into a nitride based semiconductor is being conducted. In particular, a gallium nitride (GaN) based semiconductor has properties such as a high energy gap, a high thermal stability, a high chemical stability, a high electronic saturation velocity of about $3 \times 10^7$ centimeters per second (cm/sec), and the like. Accordingly, the GaN based semiconductor may be applied to a light device, and a high frequency and high power electronic device.

A nitride based semiconductor device may have varied advantages, for example, a high breakdown field of about $3 \times 10^6$ volts per centimeter (V/cm), a maximum current density, a stable operation at a high temperature, a high thermal conductivity, and the like. Accordingly, the nitride based semiconductor device may have a high energy efficiency, and a high "response" for controlling a current flow, when compared to a typical silicon based semiconductor device. However, the nitride semiconductor device has problems of high incidence of linear defects and low heat emitting efficiency since a sapphire substrate, having a low thermal conductivity and a lattice constant different from a lattice constant of the nitride based semiconductor, is used as a base substrate.

SUMMARY

Embodiments are directed to a nitride based semiconductor device, including a first metallic junction layer, a Schottky junction layer on the first metallic junction layer, a first group III nitride semiconductor layer on the Schottky junction layer, a first insulating pattern layer on the first group III nitride semiconductor layer, the first insulating pattern layer including curved protrusions, a second group III nitride semiconductor layer laterally grown on the first group III nitride semiconductor layer that is exposed through the first insulating pattern layer, a first type group III nitride semiconductor layer on the second group III nitride semiconductor layer, the first type group III nitride semiconductor layer being simultaneously doped with aluminum (Al) and silicon (Si), an ohmic junction layer on the first type group III nitride semiconductor layer, a second metallic junction layer on the ohmic junction layer, and a metallic supporting substrate on the second metallic junction layer.

The second group III nitride semiconductor layer may include V-shaped groove patterns on a surface.

The nitride based semiconductor device may further include a third group III nitride semiconductor layer between the second group III nitride semiconductor layer and the first type group III nitride semiconductor layer, a second insulating pattern layer on the third group III nitride semiconductor layer, and a fourth group III nitride semiconductor layer laterally grown on the third group III nitride semiconductor layer that is exposed through the second insulating pattern layer.

The nitride based semiconductor device may further include a third insulating pattern layer on the fourth group III nitride semiconductor layer, the third insulating pattern layer including a plurality of patterns in a position corresponding to portions of the third group III nitride semiconductor layer that are exposed through the second insulating pattern layer, and a fifth group III nitride semiconductor layer laterally grown on the fourth group III nitride semiconductor layer that is exposed through the third insulating pattern layer.

The first metallic junction layer and the second metallic junction layer may be made of one of gold (Au) and gold-tin (Au—Sn) based metallic materials.

The first metallic junction layer and the second metallic junction layer may be coated with a metallic material including at least one of chromium (Cr), nickel (Ni), and copper (Cu).

The Schottky junction layer and the ohmic junction layer may be made of a metallic material including at least one selected from Ni, titanium (Ti), titanium nitride (TiN), platinum (Pt), gold (Au), ruthenium oxide ($RuO_2$), vanadium (V), tungsten (W), tungsten nitride (WN), hafnium (Hf), hafnium nitride (HfN), molybdenum (Mo), nickel silicide (NiSi), cobalt silicide ($CoSi_2$), tungsten silicide ($WSi_x$), platinum silicide (PtSi), iridium (Ir), zirconium (Zr), tantalum (Ta), tantalum nitride (TaN), Cu, ruthenium (Ru), and cobalt (Co).

The metallic supporting substrate may be one selected from an aluminum-silicon (Al—Si) substrate, a Si substrate, an aluminum nitride (AlN) substrate, a Cr substrate, a Ni substrate, and a Cu substrate.

Embodiments are also directed to a method of manufacturing a nitride based semiconductor device, the method including growing, on a sapphire substrate, a gallium nitride (GaN) semiconductor layer including V-shaped groove patterns on a surface, by having gallium and ammonia gas react within a first temperature range, growing a first group III nitride semiconductor layer on the GaN semiconductor layer within a second temperature range that is higher than the first temperature range, forming, on the first group III nitride semiconductor layer, a first insulating pattern layer including curved protrusions, laterally growing a second group III nitride semiconductor layer on the first group III nitride semiconductor layer that is exposed through the first insulating pattern layer, growing a first type group III nitride semiconductor layer on the second group III nitride semiconductor layer, forming an ohmic junction layer on the first type group III nitride semiconductor layer, forming a first metallic junction layer on the ohmic junction layer, bonding a metallic supporting substrate onto the first metallic junction layer, separating the sapphire substrate, and exposing the first group III nitride semiconductor layer by polishing the GaN semiconductor layer, forming a Schottky junction layer on the exposed first group III nitride semiconductor layer, and forming a second metallic junction layer on the Schottky junction layer.

The laterally growing of the second group III nitride semiconductor layer may include forming V-shaped groove patterns on a surface of the second group III nitride semiconductor layer, by having gallium and ammonia gas react within the first temperature range.

The method may further include, prior to depositing the first type group III nitride semiconductor layer, growing a third group III nitride semiconductor layer on the second group III nitride semiconductor layer, forming a second insulating pattern layer on the third group III nitride semiconductor layer, and laterally growing a fourth group III nitride semiconductor layer on the third group III nitride semiconductor layer that is exposed through the second insulating pattern layer.

The method may further include, prior to depositing the first type group III nitride semiconductor layer forming, on the fourth group III nitride semiconductor layer, a third insulating pattern layer including a plurality of patterns in a position corresponding to the fourth group III nitride semiconductor layer that is exposed through the second insulating pattern layer, and laterally growing a fifth group III nitride semiconductor layer on the fourth group III nitride semiconductor layer that is exposed through the third insulating pattern layer.

The forming of the first insulating pattern layer may include depositing an insulating material on the first group III nitride semiconductor layer, and forming the curved protrusions by etching the insulating material.

The first temperature range may be from about 800° C. to about 900° C.

The second temperature range may be from about 1000° C. to about 1400° C.

Embodiments are also directed to a method of manufacturing a nitride based semiconductor device, the method including growing a gallium nitride (GaN) semiconductor layer on a sapphire substrate by reacting gallium and ammonia gas within a temperature range of about 800° C. to about 900° C. such that V-shaped groove patterns are formed on a surface of the gallium nitride (GaN) semiconductor layer, growing a first group III nitride semiconductor layer on the GaN semiconductor layer within a temperature range of about 1000° C. to about 1400° C., determining locations of the V-shaped groove patterns on the surface of the gallium nitride (GaN) layer and forming a first insulating pattern layer in a form of curved protrusions on the first group III nitride semiconductor layer, the first insulating pattern layer being formed in locations on the first group III nitride semiconductor layer that do not correspond to locations of the V-shaped groove patterns on the surface of the gallium nitride (GaN) layer, and the first group III nitride semiconductor being exposed in locations of the first group III nitride semiconductor layer that do correspond to locations of the V-shaped groove patterns on the surface of the gallium nitride (GaN) layer, laterally growing a second group III nitride semiconductor layer on the first group III nitride semiconductor layer that is exposed through the first insulating pattern layer, and separating the sapphire substrate, and exposing the first group III nitride semiconductor layer by polishing the GaN semiconductor layer.

The method may further include, before the separating of the sapphire substrate, growing a first type group III nitride semiconductor layer on the second group III nitride semiconductor layer, and forming an ohmic junction layer on the first type group III nitride semiconductor layer, forming a first metallic junction layer on the ohmic junction layer, and bonding a metallic supporting substrate onto the first metallic junction layer.

The method may further include, after separating the sapphire substrate, forming a Schottky junction layer on the exposed first group III nitride semiconductor layer, and forming a second metallic junction layer on the Schottky junction layer.

The laterally growing of the second group III nitride semiconductor layer may include forming V-shaped groove patterns on a surface of the second group III nitride semiconductor layer, by having gallium and ammonia gas react within a temperature range of about 800° C. to about 900° C. The method may further include growing a third group III nitride semiconductor layer on the second group III nitride semiconductor layer, forming a second insulating pattern layer on the third group III nitride semiconductor layer, the third group III nitride semiconductor layer being exposed through the second insulating pattern layer, laterally growing a fourth group III nitride semiconductor layer on the third group III nitride semiconductor layer that is exposed through the second insulating pattern layer, forming a third insulating pattern layer on the fourth group III nitride semiconductor layer, the third insulating pattern layer being staggered with respect to the second insulating pattern layer such that a plurality of patterns of the third insulating pattern layer may be positioned corresponding to the fourth group III nitride semiconductor layer that is exposed through the second insulating pattern layer, and laterally growing a fifth group III nitride semiconductor layer on the fourth group III nitride semiconductor layer that is exposed through the third insulating pattern layer.

The method may further include, prior to depositing the first type group III nitride semiconductor layer, growing a first type group III nitride semiconductor layer on the fifth group III nitride semiconductor layer, forming an ohmic junction layer on the first type group III nitride semiconductor layer, forming a first metallic junction layer on the ohmic junction layer, bonding a metallic supporting substrate onto the first metallic junction layer. The method may further include, after separating the sapphire substrate, forming a Schottky junction layer on the exposed first group III nitride semiconductor layer, and forming a second metallic junction layer on the Schottky junction layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
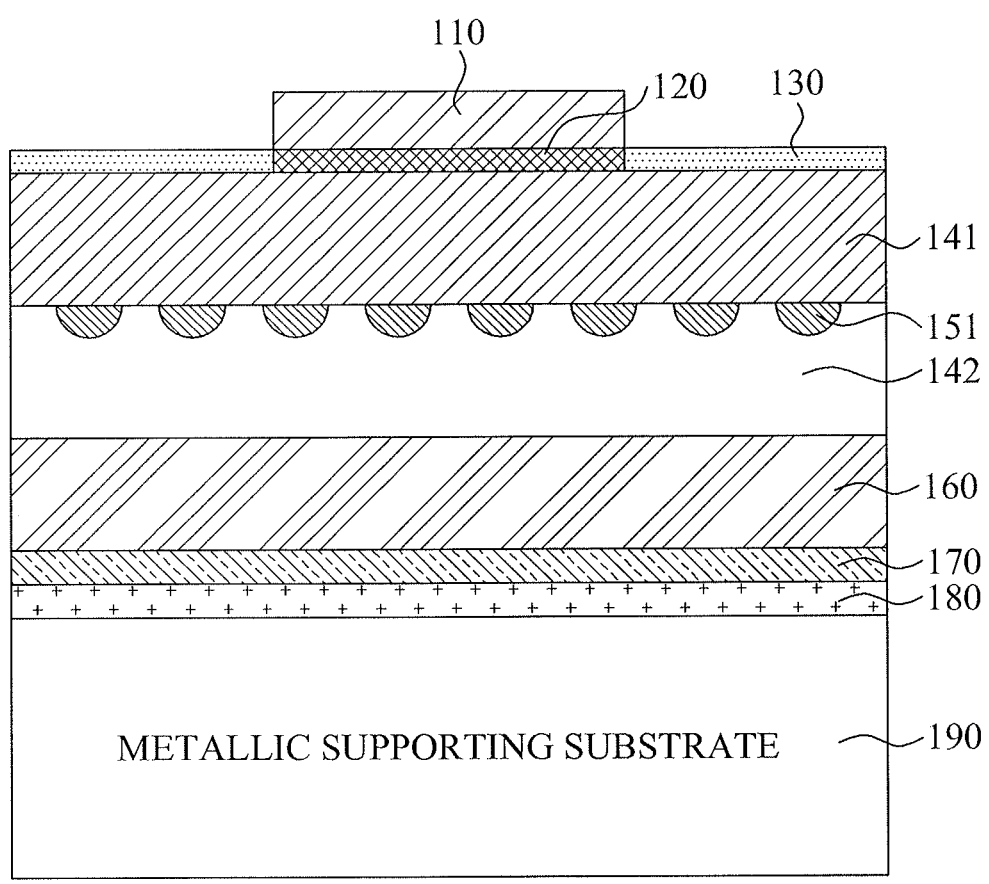
FIG. 1 illustrates a cross-sectional view depicting a structure of a nitride based semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view depicting a structure of a nitride based semiconductor device 100 according to an embodiment. Hereinafter, a nitride based semiconductor device will be referred to as a 'semiconductor device.' Referring to FIG. 1, the semiconductor device 100 may include a first metallic junction layer 110, a Schottky junction layer 120, a first group III nitride semiconductor layer 141, a first insulating pattern layer 151, a second group III nitride semiconductor layer 142, a first type gallium nitride (GaN) semiconductor layer 160, an ohmic junction layer 170, a second metallic junction layer 180, and a metallic supporting substrate 190.

Although the semiconductor layer 100 of FIG. 1 is depicted as having a structure in which each layer is laminated sequentially on the metallic supporting substrate 190, a structure of the semiconductor layer 100 will be described in order from the first metallic junction layer 110 to the metallic supporting substrate 190, in view of the shape or pattern of each layer.

The Schottky junction layer 120 may be formed on the first metallic junction layer 110. An insulating layer 130 may be formed around the Schottky junction layer 120.

The first metallic junction layer 110 may be formed of one of gold (Au) and gold-tin (Au—Sn) based metallic materials. A surface of the first metallic junction layer 110 may be coated with a metallic material including at least one of chromium (Cr), nickel (Ni), and copper (Cu).

The first group III nitride semiconductor layer 141 may be located on the Schottky junction layer 120. In view of the sequence of the manufacturing process, the first group III nitride semiconductor layer 141 may not be formed on the Schottky junction layer 120 and the first metallic junction layer 110. Instead, the Schottky junction layer 120 and the first metallic junction layer 110 may be bonded onto an already-formed first group III nitride semiconductor layer 141.

The first group III nitride semiconductor layer 141 may be formed initially on a GaN semiconductor layer (not shown) including V-shaped groove patterns on a surface. The GaN semiconductor layer may prevent internally generated linear defects, using the V-shaped groove patterns. Accordingly, the linear defects may not be transferred to the first group III nitride semiconductor layer 141 that is formed on the GaN semiconductor layer. A portion of the linear defects may be bent in the first group III nitride semiconductor layer 141. Accordingly, an incidence of linear defects in the first group III nitride semiconductor layer 141 may decrease.

The GaN semiconductor layer may be removed through polishing in a manufacturing process and thus, may not be included in the completed semiconductor device 100. However, the GaN semiconductor layer may be desirable to the manufacturing process for reducing occurrences of linear defects in the first group III nitride semiconductor layer 141. This will be described in detail below in a description relating to a method of manufacturing a semiconductor device.

The first insulating pattern layer 151 may be formed on the first group III nitride semiconductor layer 141, and may include curved protrusions. The first group III nitride semiconductor layer 141 may be exposed through gaps among the curved protrusions. The curved protrusions constituting the first insulating pattern layer 151 may be disposed on the first group III nitride semiconductor layer 141, particularly, in areas corresponding to areas excluding the V-shaped groove patterns of the GaN semiconductor layer. Linear defects in the GaN semiconductor layer may be prevented by the V-shaped groove patterns. Accordingly, the linear defects existing in the GaN semiconductor layer may not be transferred to the first group III nitride semiconductor layer 141. The linear defects may not be prevented in the areas of the GaN semiconductor layer excluding the V-shaped groove patterns. Such defects could be transferred to the first group III nitride semiconductor layer 141. To prevent the spread of such linear defects, the curved protrusions may be disposed in the corresponding areas.

The second group III nitride semiconductor layer 142 may be laterally grown on the first group III nitride semiconductor layer 141 that is exposed through the first insulating pattern layer 151. The second group III nitride semiconductor layer 142 may be laterally grown to cover the curved protrusions of the first insulating pattern layer 151. A growth direction of the second group III nitride semiconductor layer 142 may be different from a crystallographic orientation of the curved protrusions.

The first type group III nitride semiconductor layer 160 may be formed on the second group III nitride semiconductor layer 142. The first type group III nitride semiconductor layer 160 may correspond to an n-type GaN semiconductor layer in which aluminum (Al) and silicon (Si) are doped simultaneously. The first type group III nitride semiconductor layer 160 may be doped at a low concentration. For example, Al may be doped at a concentration of about 0.1 to about 0.8%.

The ohmic junction layer 170 may be formed on the first type group III nitride semiconductor layer 160.

The Schottky junction layer 120 and the ohmic junction layer 170 may be formed of a metallic material including at least one of Ni, titanium (Ti), titanium nitride (TiN), platinum (Pt), gold (Au), ruthenium oxide ($RuO_2$), vanadium (V), tungsten (W), tungsten nitride (WN), hafnium (Hf), hafnium nitride (HfN), molybdenum (Mo), nickel silicide (NiSi), cobalt silicide ($CoSi_2$), tungsten silicide ($WSi_x$), platinum silicide (PtSi), iridium (Ir), zirconium (Zr), tantalum (Ta), tantalum nitride (TaN), Cu, ruthenium (Ru), and cobalt (Co).

The second metallic junction layer 180 may be formed on the ohmic junction layer 170 to bond the ohmic junction layer 180 and the metallic supporting substrate 190.

The metallic supporting substrate 190 may support each of the aforementioned layers. The metallic supporting substrate 190 may be formed of a metallic substrate having a high thermal conductivity, for example, one of an aluminum-silicon (Al—Si) substrate, a Si substrate, an aluminum nitride (AlN) substrate, a Cr substrate, a Ni substrate, and a Cu substrate.

The metallic supporting substrate 190 may support the layers, and also may emit heat generated when the semiconductor device 100 is operated. Accordingly, a heat emitting efficiency of the semiconductor device 100 may be improved by the metallic supporting substrate 190.

Figure 2:
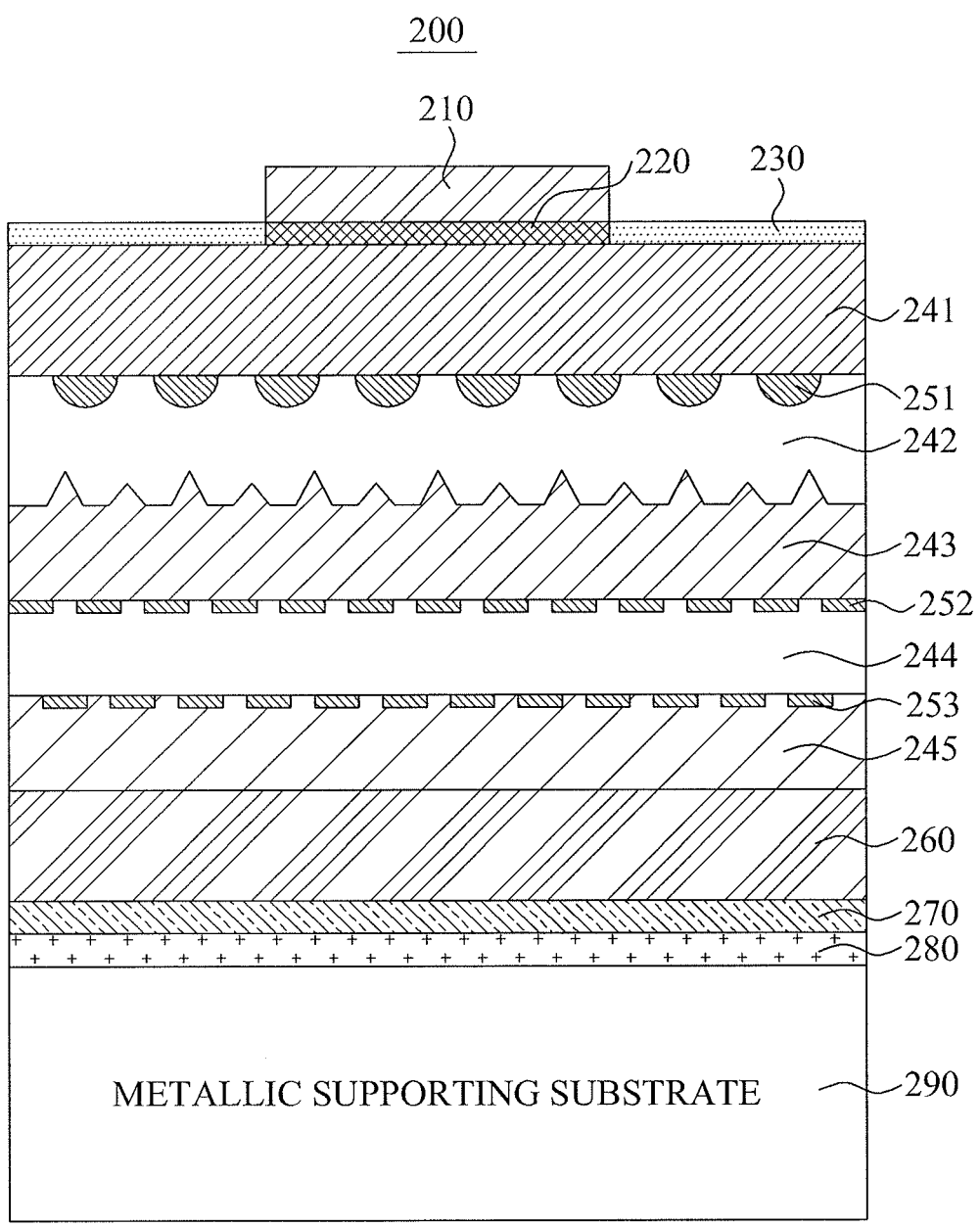
FIG. 2 illustrates a cross-sectional view depicting a structure of a nitride based semiconductor device according to another embodiment.

FIG. 2 is a cross-sectional view illustrating a structure of a nitride based semiconductor device 200 according to another embodiment. Referring to FIG. 2, the semiconductor device 200 may include a first metallic junction layer 210, a Schottky junction layer 220, an insulating layer 230, a first group III nitride semiconductor layer 241, a first insulating pattern layer 251, a second group III nitride semiconductor layer 242, a third group III nitride semiconductor layer 243, a second insulating pattern layer 252, a fourth group III nitride semiconductor layer 244, a third insulating pattern layer 253, a fifth group III nitride semiconductor layer 245, a first type group III nitride semiconductor layer 260, an ohmic junction layer 270, a second metallic junction layer 280, and a metallic supporting substrate 290.

The semiconductor device 200 of FIG. 2, when compared to the semiconductor device 100 of FIG. 1, may have a structure further including the third group III nitride semiconductor layer 243, the second insulating pattern layer 252, the fourth group III nitride semiconductor layer 244, the third insulating pattern layer 253, and the fifth group III nitride semiconductor layer 245 between the second group III nitride semiconductor layer 242 and the first type group III nitride semiconductor layer 260.

Also, the second group III nitride semiconductor layer 142 in the semiconductor device 100 of FIG. 1 may have a structure in which both surfaces are flat, whereas the second group III nitride semiconductor layer 242 in the semiconductor device 200 of FIG. 2 may have a structure in which V-shaped groove patterns are formed on one surface. Accordingly, descriptions provided with reference to FIG. 2 will focus on elements which are not included in the semiconductor device 100 of FIG. 1.

The second group III nitride semiconductor layer 242 may be laterally grown on the first group III nitride semiconductor layer 241 that is exposed through the first insulating pattern layer 251. In this instance, the second group III nitride semiconductor layer 242 may include V-shaped groove patterns on a surface. Whether the V-shaped groove patterns are to be included on a surface of the second group III nitride semiconductor layer 242 may be determined by changing a growth temperature range when the second group III nitride semiconductor layer 242 is laterally grown.

Occurrence of linear defects may be reduced by the lateral growth of the second group III nitride semiconductor layer 242, and the second group III nitride semiconductor layer 242 may prevent linear defects by forming V-shaped groove patterns on a surface. Accordingly, any linear defects that are formed may not be transferred to the third group III nitride semiconductor layer 243 that is formed on the second group III nitride semiconductor layer 242, and a portion of the linear defects may be bent in the second group III nitride semiconductor layer 242.

The third group III nitride semiconductor layer 243 may be formed on the second group III nitride semiconductor layer 242.

The second insulating pattern layer 252 may be formed on the third group III nitride semiconductor layer 243, and may include striped patterns that are disposed at predetermined intervals. The third group III nitride semiconductor layer 243 may be exposed through the second insulating pattern layer 252.

The fourth group III nitride semiconductor layer 244 may be laterally grown on the third group III nitride semiconductor layer 243 that is exposed though the second insulating pattern layer 252.

The third insulating pattern layer 253 and the fifth group III nitride semiconductor layer 245 may be formed on the fourth group III nitride semiconductor layer 244. In particular, the third insulating pattern layer 253 may be used to prevent linear defects that may exist in an internal portion of the fourth group III nitride semiconductor layer 244. The third insulating pattern layer 253 may include patterns staggered from the second insulating pattern layer 252.

The first type group III nitride semiconductor layer 260, the ohmic junction layer 270, the second metallic junction layer 280, and the metallic supporting substrate 290 may be laminated sequentially on the fifth group III nitride semiconductor layer 245.

FIGS. 3 through 17 are cross-sectional views illustrating stages of a method of manufacturing a nitride based semiconductor device according to an embodiment.

Figure 3:
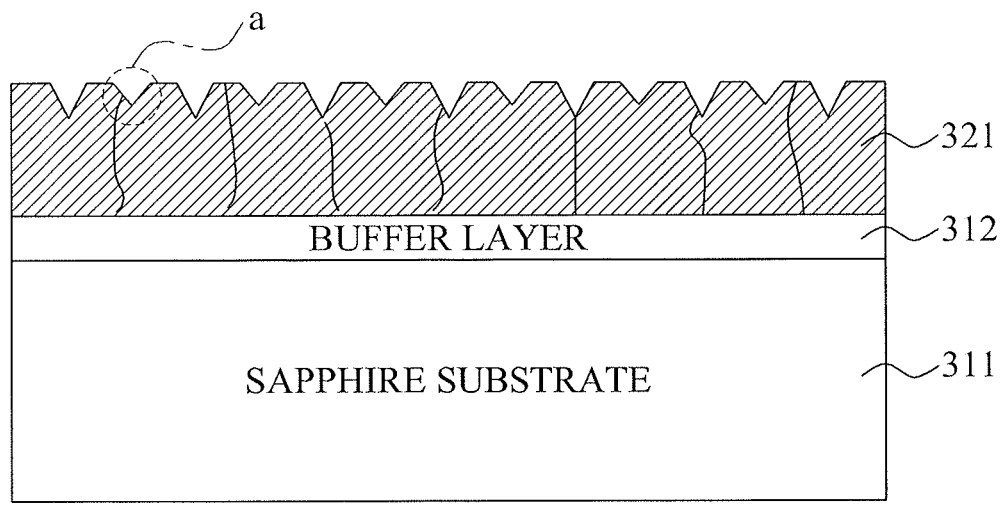
FIGS. 3 through 17 illustrate cross-sectional views depicting stages of a method of manufacturing a nitride based semiconductor device according to an embodiment.

Referring to FIG. 3, the manufacturing method may include a process of growing a GaN semiconductor layer 321 on a sapphire substrate 311 including a buffer layer 312.

In particular, the sapphire substrate 311 may be disposed in a Metal Organic Chemical Vapor Deposition (MOCVD) chamber, and gallium and ammonia gas may be inserted into the MOCVD chamber. The GaN semiconductor layer 321 may be formed on the sapphire substrate 311 by a reaction of the inserted gallium and ammonia gas. In this instance, an internal temperature of the MOCVD chamber at a time of growing the GaN semiconductor layer 321 may be within a first temperature range. The first temperature range may be from 800° C. to 900° C.

Generally, the GaN semiconductor layer 321 may be grown within a second temperature range from 1,000° C. to 1,400° C. However, according to an embodiment, by growing the GaN semiconductor layer 321 within the first temperature range that is lower than 1,000° C., V-shaped groove patterns may be formed on a growing surface of the GaN semiconductor layer 321. When the GaN semiconductor layer 321 is grown within the first temperature range that is lower than a typical growth temperature, a degree of dissociation of ammonia gas may decrease and thus, a portion of the GaN semiconductor layer 321 may not be grown. The portion that may not be grown may appear in a form of V-shaped groove patterns "a" on the growing surface of the GaN semiconductor layer 321.

Figure 18:
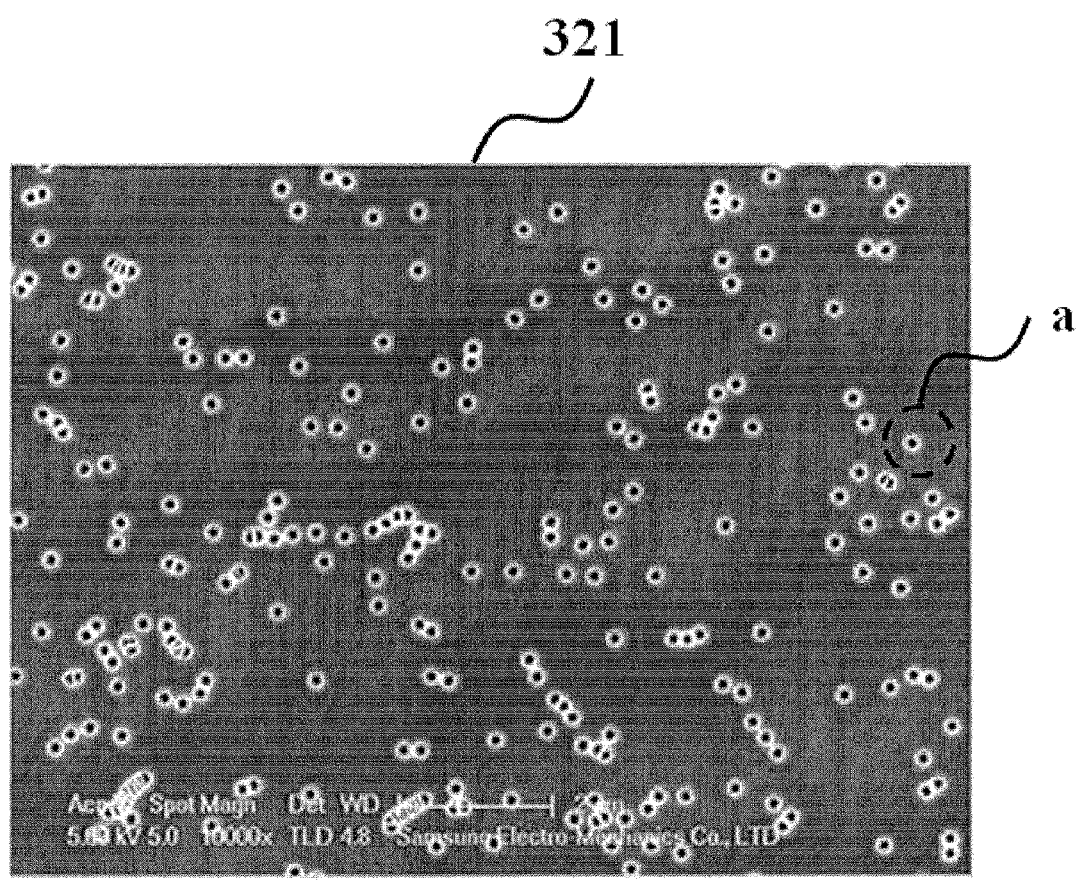
FIG. 18 illustrates a scanning electron microscope (SEM) photograph of one surface of a GaN semiconductor layer of FIG. 3.

FIG. 18 is a scanning electron microscope (SEM) image of one surface of the GaN semiconductor layer 321 of FIG. 3. Referring to FIG. 18, the growing surface of the GaN semiconductor layer 321 may include V-shaped groove patterns "a". The V-shaped groove patterns "a" may have irregular arrangements on the growing surface.

Figure 4:
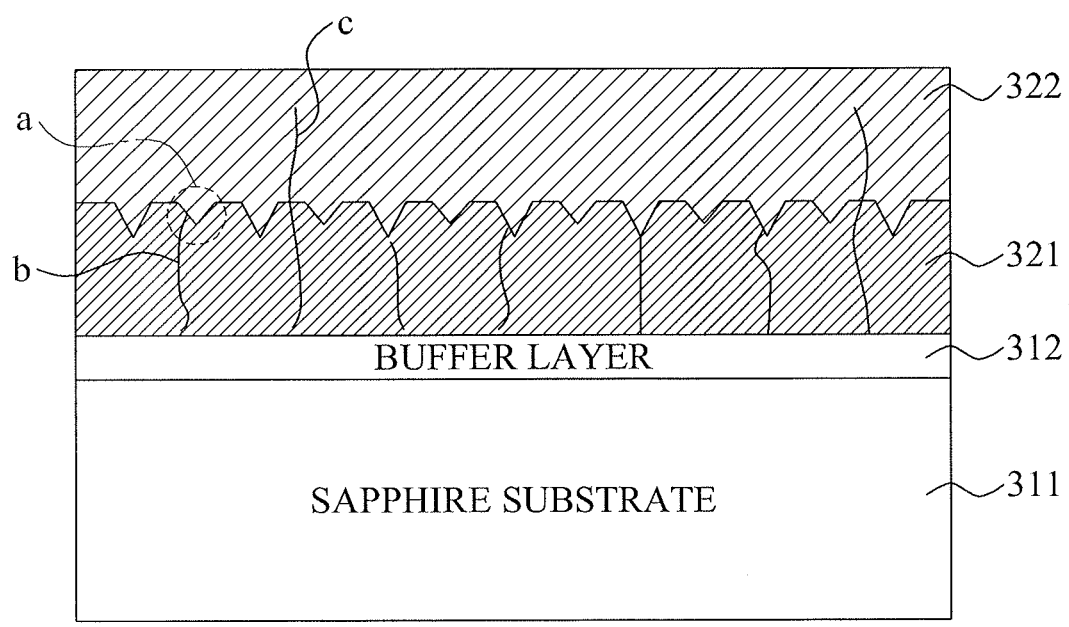

Referring to FIG. 4, the manufacturing method may include a process of growing a first group III nitride semiconductor layer 322 on the GaN semiconductor layer 321. The first group III nitride semiconductor layer 322 may correspond to a layer used to flatten the surface of the GaN semiconductor layer 321 by filling the V-shaped groove patterns included in the GaN semiconductor layer 321.

The first group III nitride semiconductor layer 322 may be grown within the second temperature range from 1,000° C. to 1,400° C. When the first group III nitride semiconductor layer 322 is grown, linear defects may be prevented by the V-shaped groove patterns included in the GaN semiconductor layer 321.

The GaN semiconductor layer 321 may have a lattice constant different from a lattice constant of the sapphire substrate 311. Accordingly, lattice mismatching of about 13% may occur, whereby a defect density may be greater than or equal to about $10^8$ per square centimeter (/cm$^2$). In a structure in which a current may flow through in a vertical direction, for example, in the semiconductor device 100 of FIG. 1 or the semiconductor layer 200 of FIG. 2, a leakage current may be generated by defects, and current crowding may occur. The linear defects generated or existing in an internal portion of the GaN semiconductor layer 321 may be prevented from being transferred to a semiconductor layer that is disposed on the GaN semiconductor layer 321 by the V-shaped groove patterns "a".

As shown in FIG. 4, linear defects "c" generated in areas where the V-shaped groove patterns "a" are not formed may be transferred to the first group III nitride semiconductor layer 322. However, linear defects "b" generated in areas where the V-shaped groove patterns "a" are formed may be prevented from being transferred to the first group III nitride semiconductor layer 322.

Figure 5:
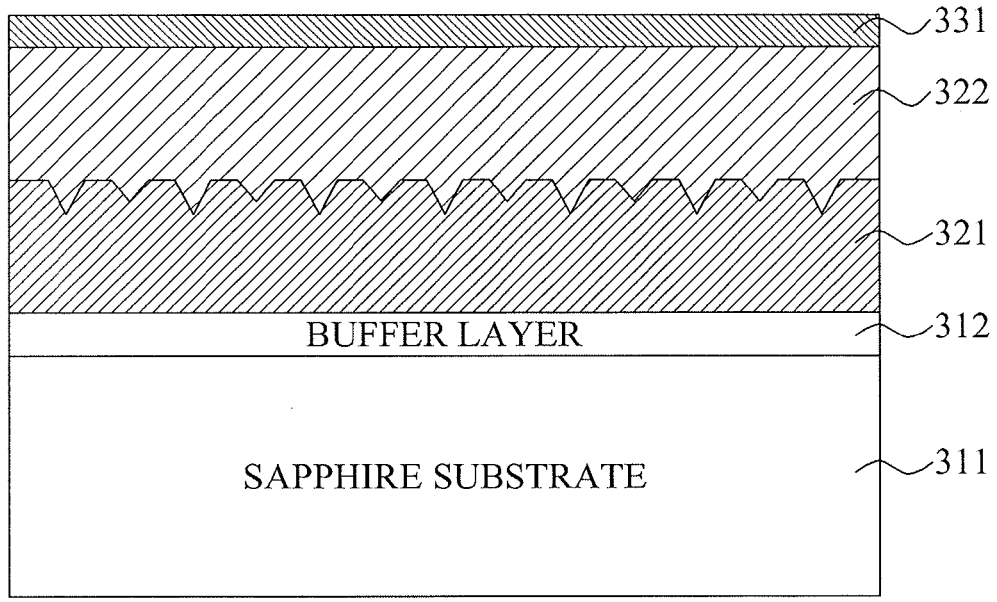
Figure 6:
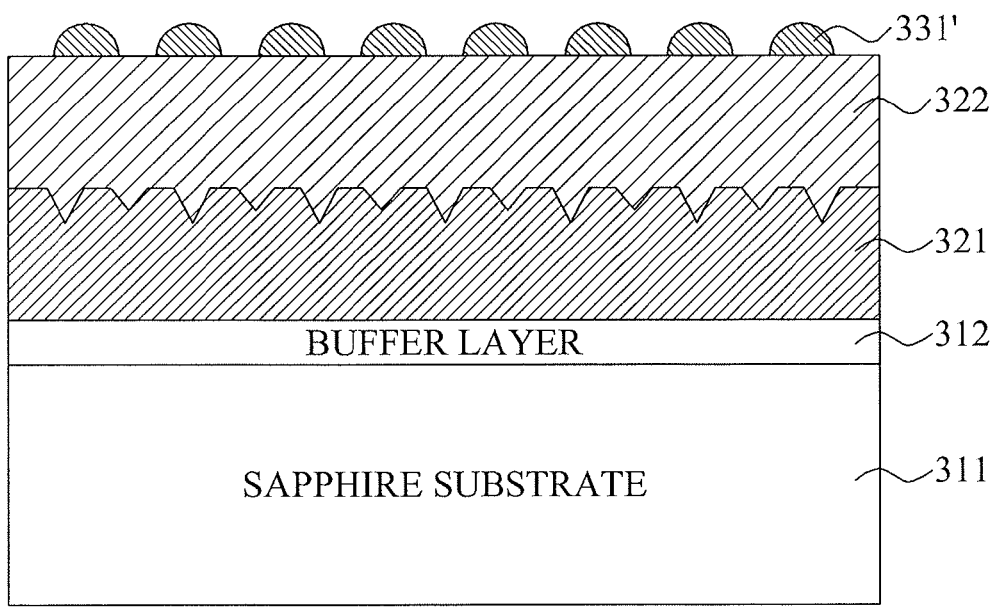

Referring to FIGS. 5 and 6, the manufacturing method may include a process of forming a first insulating pattern layer 331' including curved protrusions, on the first group III nitride semiconductor layer 322.

In particular, an insulating material 331 may be deposited on the first group III nitride semiconductor layer 322, as shown in FIG. 5. The first insulating pattern layer 331' including the curved protrusions may be formed by etching the insulating material 331, as shown in FIG. 6. The insulating material 331 may correspond to silicon oxide ($SiO_2$), and may be deposited to a thickness of about 1.5 micrometers (μm). According to an embodiment, a curved protrusion may refer to a protrusion of which the entire surface may be curved, where no distinction can be made between an upper end portion and a side portion and a flat surface is absent. Accordingly, a curvature of each region may be greater than 0.

In the GaN semiconductor layer 321, the linear defects may be prevented in areas where V-shaped groove patterns are present, whereas the linear defects may not be prevented in areas where the V-shaped groove patterns are not present. Accordingly, the first insulating pattern layer 331' may be formed so that the curved protrusions may be disposed in the areas of first group III nitride semiconductor layer 322 corresponding to areas of the GaN semiconductor layer where the V-shaped groove patterns are not present. To achieve the foregoing, the areas where the V-shaped groove patterns are present may be verified by scanning or photographing a growing surface of the GaN semiconductor layer 321 while the GaN semiconductor layer 321 is deposited. The first insulating pattern layer 331' may be formed by etching the insulating material 331 so that the curved protrusions may be disposed in the verified areas, on the first group III nitride semiconductor layer 322.

Figure 7:
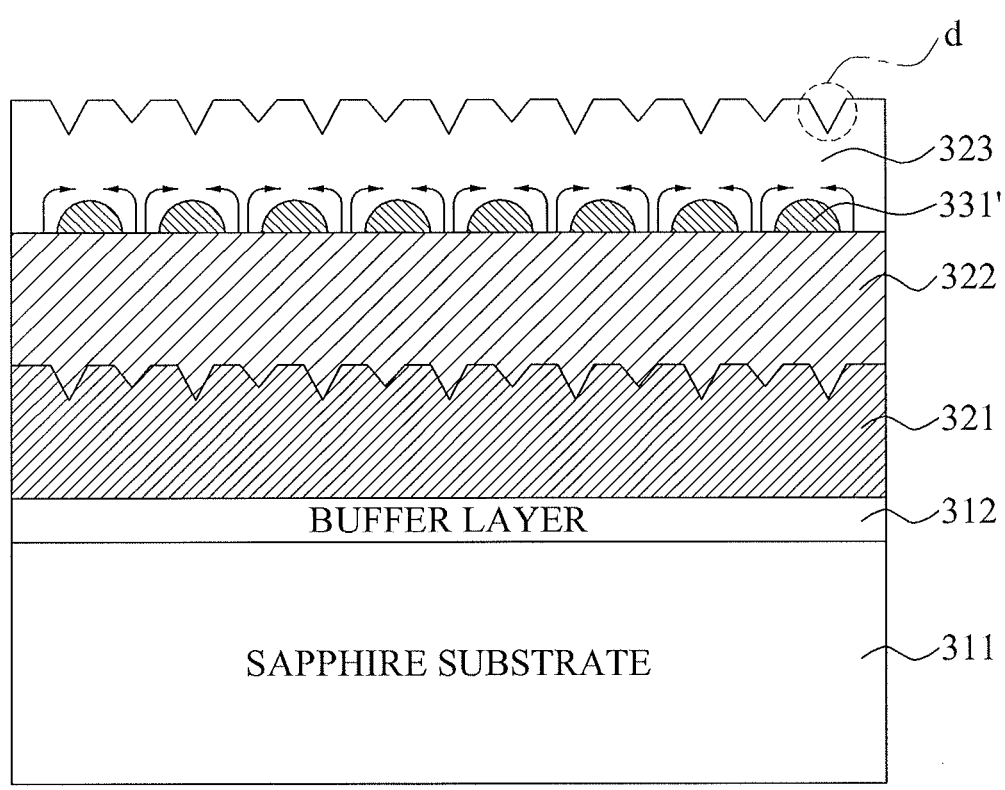

Referring to FIG. 7, the manufacturing method may include a process of laterally growing a second group III nitride semiconductor layer 323 on the first group III nitride semiconductor layer 322 that is exposed through the first insulating pattern layer 331'.

The second group III nitride semiconductor layer 323 may be grown in an identical or similar environment to that in which the GaN semiconductor layer 321 is grown. In particular, gallium and ammonia gas may be inserted into the MOCVD chamber, and the second group III nitride semiconductor layer 323 may be grown within the first temperature range. In this instance, the second group III nitride semiconductor layer 323 may not grow on the first insulating pattern layer 331', and instead, may grow on the first group III nitride semiconductor layer 322 that is exposed through the first insulating pattern layer 331'. Accordingly, the second group III nitride semiconductor layer 323 may be grown and combined in a lateral direction of the first insulating pattern layer 331'.

The second group III nitride semiconductor layer 323 may be laterally grown over the curved protrusions. When the second group III nitride semiconductor layer 322 is laterally grown, a growth direction of the second group III nitride semiconductor layer 323 may be different from a crystallographic orientation of the curved protrusions. Accordingly, the second group III nitride semiconductor layer 323 may be formed by the lateral growth since the second group III nitride semiconductor layer 323 may not grow on surfaces of the curved protrusions. In particular, the second group III nitride semiconductor layer 323 may start growing from a surface of the first group III nitride semiconductor layer 322 that is exposed through gaps among the curved protrusions. As a thickness of the second group III nitride semiconductor layer 323 increases, the second group III nitride semiconductor layer 323 may be grown along side surfaces of the curved protrusions, and may be formed to cover uppermost portions of the curved protrusions.

Internal defects in the second group III nitride semiconductor layer 323 may be reduced by the lateral growth, and occurrences of linear defects may be prevented by the first insulating pattern layer 331'. V-shaped groove patterns "d" may be generated on the growing surface of the second group III nitride semiconductor layer 323.

Figure 8:
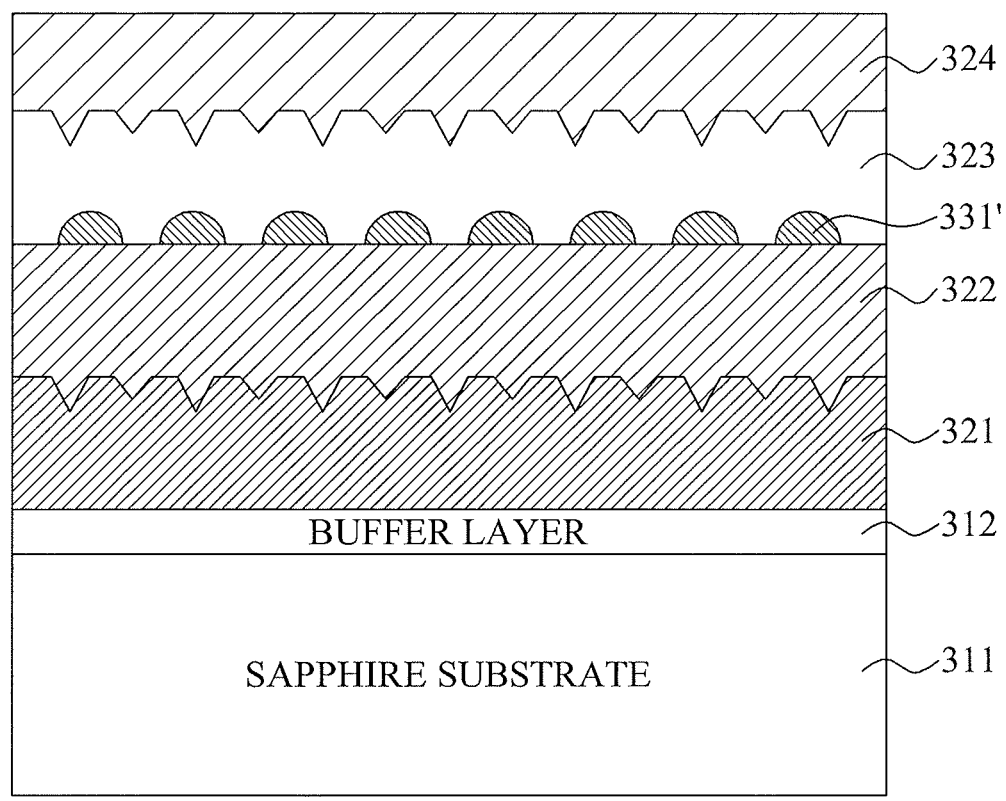

Referring to FIG. 8, the manufacturing method may include a process of forming a third group nitride semiconductor layer 324 on the second group III nitride semiconductor layer 323. The third group III nitride semiconductor layer 324 may correspond to a layer used to flatten the surface of the second group III nitride semiconductor layer 323 by filling the V-shaped groove patterns included in the second group III nitride semiconductor layer 323.

The third group III nitride semiconductor layer 324 may be re-grown in an identical or similar environment as that in which the first group III nitride semiconductor layer 322 is grown. When the third group III nitride semiconductor layer 324 is re-grown, linear defects may be prevented by the V-shaped groove patterns included in the second group III nitride semiconductor layer 323. Accordingly, the linear defects generated or existing in the second group III nitride semiconductor layer 323 may be prevented from being transferred to the third group III nitride semiconductor layer 324.

Figure 9:
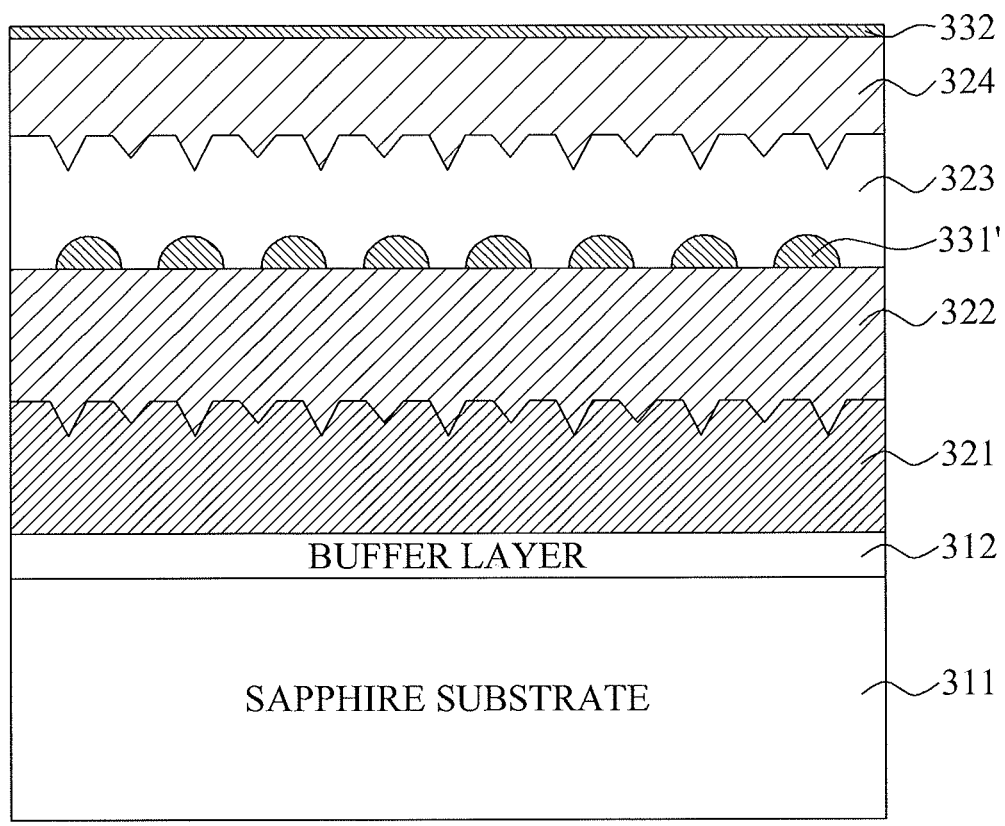
Figure 10:
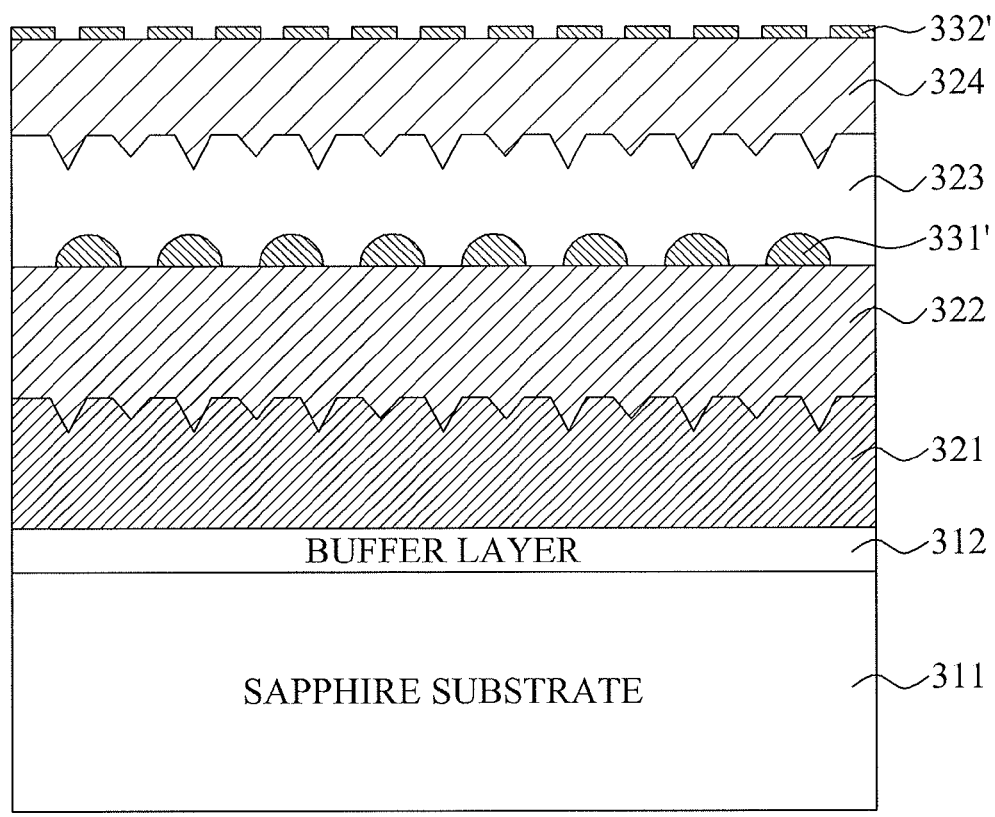

Referring to FIGS. 9 and 10, the manufacturing method may include a process of forming a second insulating pattern layer 332' on the third group III nitride semiconductor layer 324.

In particular, an insulating material 332 may be deposited on the third group III nitride semiconductor layer 324, as shown in FIG. 9. The second insulating pattern layer 332' including striped patterns may be formed by etching the insulating material 332, as shown in FIG. 10. Similar to the first insulating pattern layer 331', the insulating material 332 may correspond to $SiO_2$, and may be deposited at a thickness of about 1 μm to 1.5 μm. In other implementations, the second insulating pattern layer 332' may include curved protrusions that are identical or similar to the curved protrusions included in the first insulating pattern layer 331', instead of the striped patterns.

As described above, occurrences of linear defects may be prevented through the GaN semiconductor layer 321 including the V-shaped groove patterns, the first group III nitride semiconductor layer 322 used for flattening, and the first insulating pattern layer 331'. When composition of a semiconductor layer including V-shaped groove patterns, a semiconductor layer for flattening, and an insulating pattern layer is regarded as a single structure to prevent occurrences of linear defects, the occurrence of the linear defects may be minimized by forming the structure on the sapphire substrate 311 a number of times.

In particular, occurrence of linear defects in a semiconductor device may be reduced by primarily preventing the occurrence of the linear defects through "the GaN semiconductor layer 321—the second group III nitrides semiconductor layer 322—the firs insulating pattern layer 331'," and secondarily preventing the occurrence of the linear defects through "the second group III nitride semiconductor layer 323—the third group III nitride semiconductor layer 324—the second insulating pattern layer 332'," which may have a structure identical to or similar to a structure of "the GaN semiconductor layer 321—the second group III nitrides semiconductor layer 322—the firs insulating pattern layer 331'."

Figure 11:
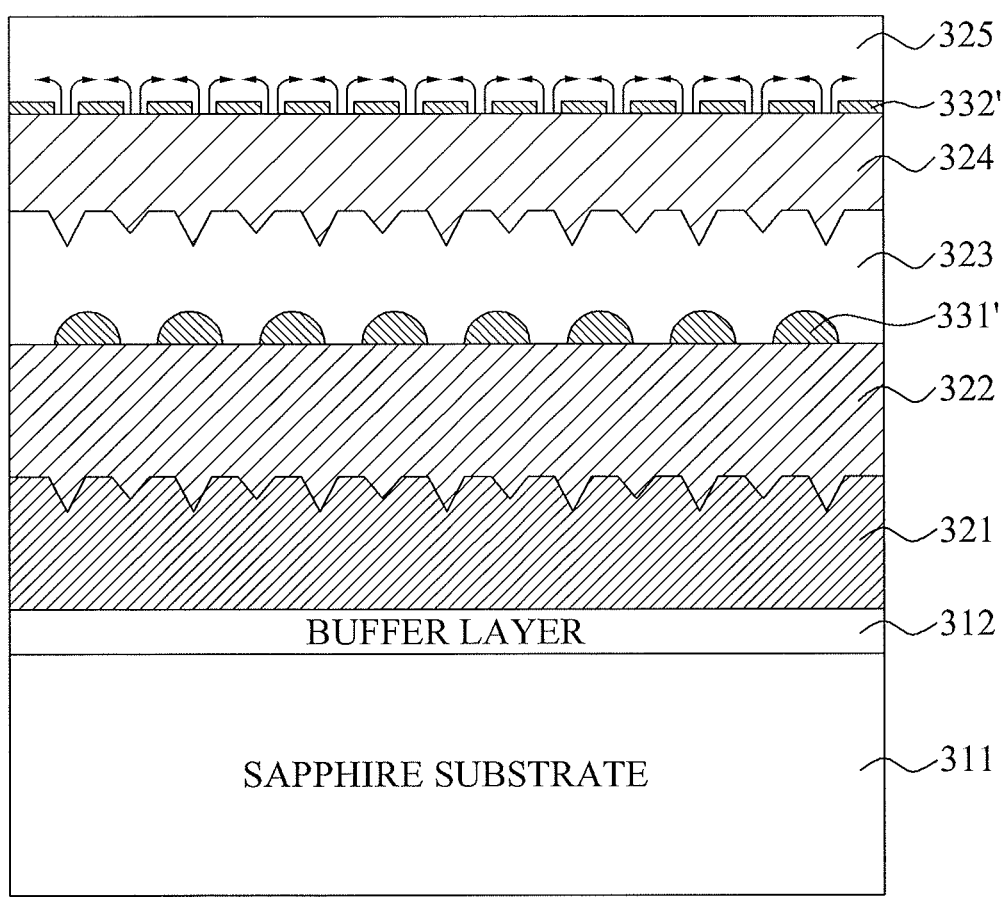

Referring to FIG. 11, the manufacturing method may include a process of laterally growing a fourth group III nitride semiconductor layer 325 on the third group III nitride semiconductor layer 324 that is exposed through the second insulating pattern layer 332'. The fourth group III nitride semiconductor layer 325 may be grown in an identical environment to that in which the first group III nitride semiconductor layer 322 is grown.

The fourth group III nitride semiconductor layer 325 may not grow on the second insulating pattern layer 332', and may grow on the third group III nitride semiconductor layer 324 that is exposed through the second insulating pattern layer 332'. Accordingly, the fourth group III nitride semiconductor layer 325 may be grown and combined in a lateral direction of the second insulating pattern layer 332'.

Figure 12:
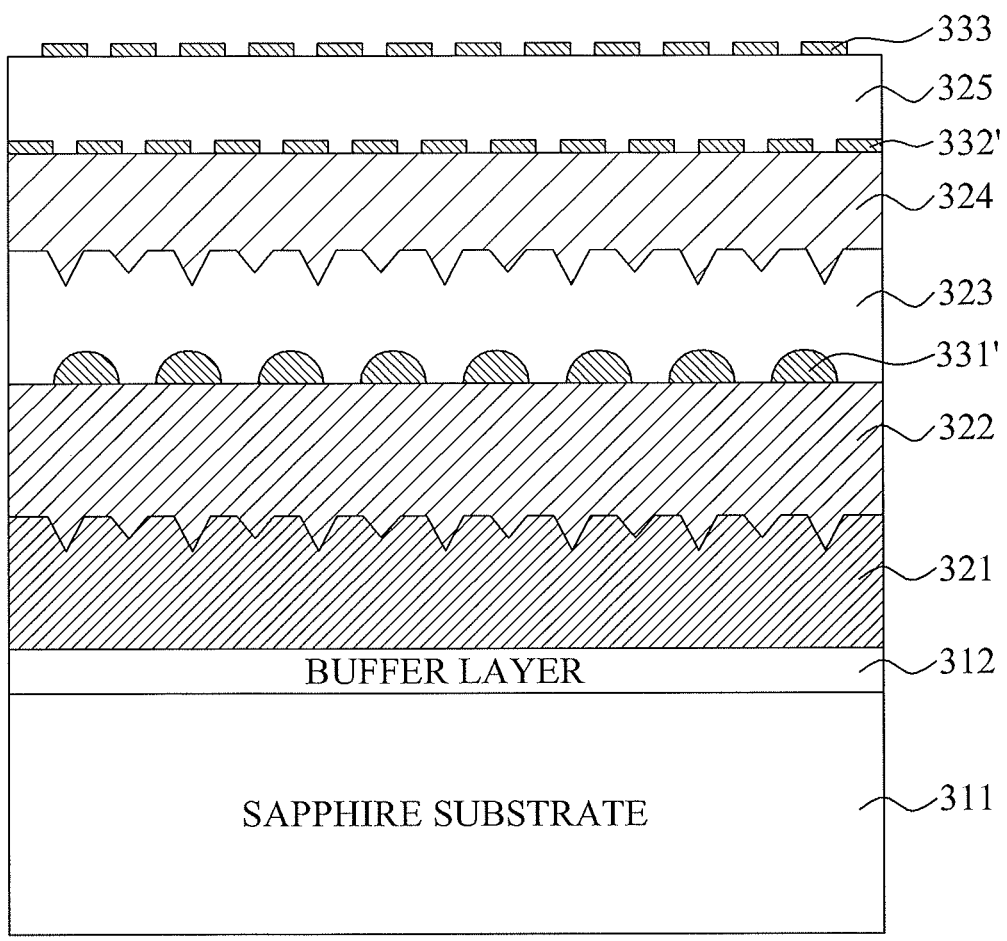

Referring to FIG. 12, the manufacturing method may include a process of forming a third insulating pattern layer 333 on the fourth group III nitride semiconductor layer 325. The third insulating pattern layer 333 may be formed by an identical or similar method to that used to form the second insulating pattern layer 332'.

Figure 13:
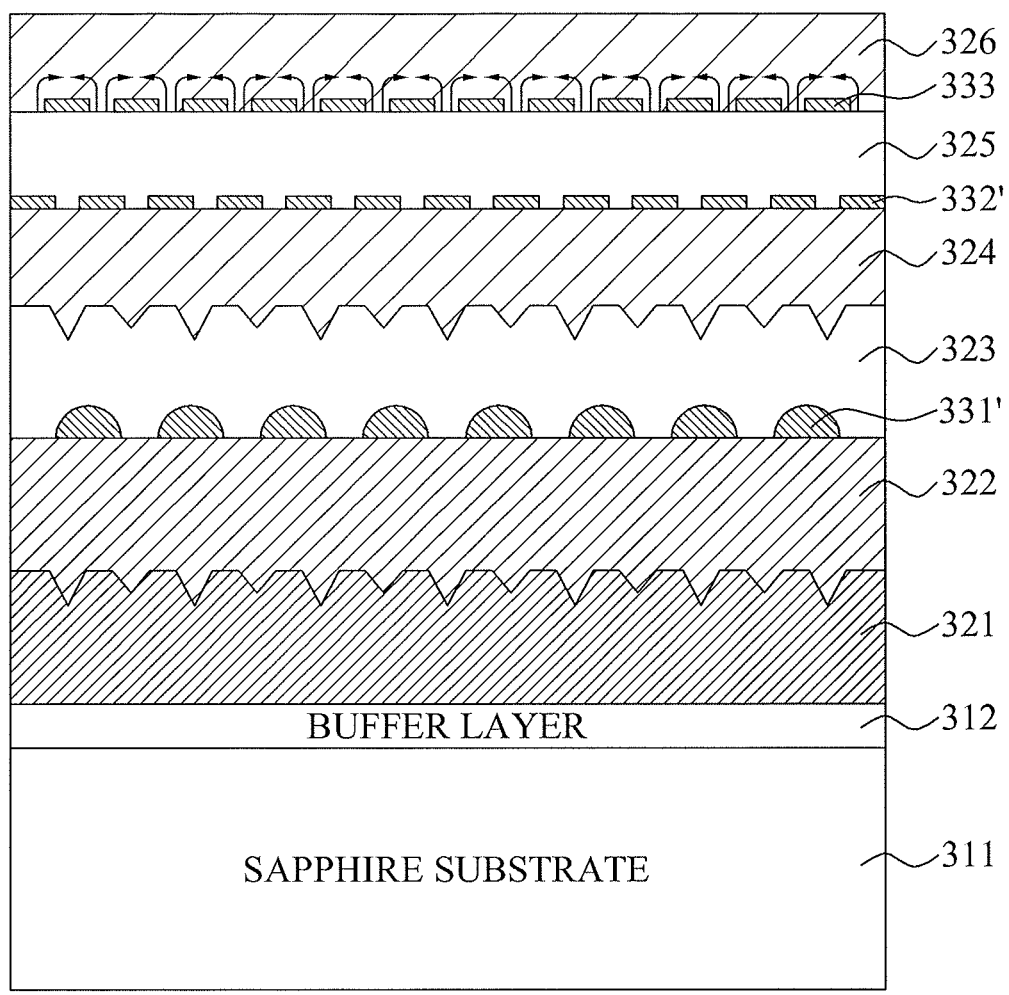

Referring to FIG. 13, the manufacturing method may include a process of laterally growing a fifth group III nitride semiconductor layer 326 on the fourth group III nitride semiconductor layer 325 that is exposed through the third insulating pattern layer 333. The fifth group III nitride semiconductor layer 326 may be grown in an identical or similar environment as that in which the fourth group III nitride semiconductor layer 325 may be grown.

The third insulating pattern layer 333 of FIGS. 12 and 13 may be used to prevent linear defects that may exist in an internal portion of the fourth group III nitride semiconductor layer 325 from spreading to the fifth group III nitride semiconductor layer 326. The third insulating pattern layer 333 including a plurality of patterns may be formed on the fourth group III nitride semiconductor layer 325 that may include linear defects and is exposed through the second insulating pattern layer 332'. Accordingly, the third insulating pattern layer 333 may prevent the linear defects generated or existing in the fourth group III nitride semiconductor layer 325 from spreading to the fifth group III nitride semiconductor layer 326.

Figure 14:
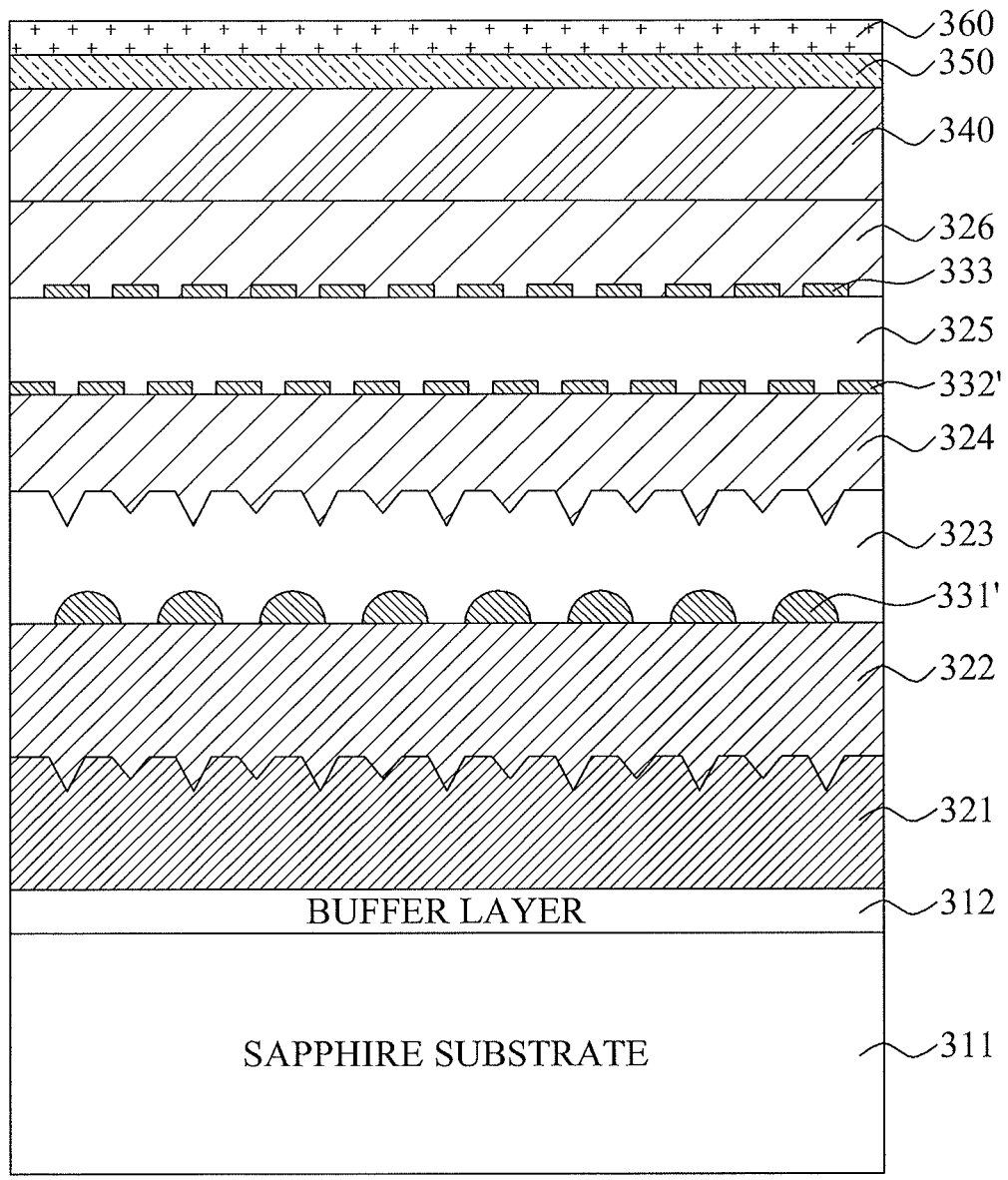

Referring to FIG. 14, the manufacturing method may include a process of depositing a first type group III nitride semiconductor layer 340, and forming an ohmic junction layer 350 and a first metallic junction layer 360. In particular, the first type group III nitride semiconductor layer 340, that is, an n-type group III nitride semiconductor layer, for example, an n-GaN semiconductor layer, may be deposited by doping Al and Si on the fifth group III nitride semiconductor layer 326 at a low concentration. The ohmic junction layer 350 and the first metallic junction layer 360 may be formed sequentially, by depositing a metallic material on the first type group III nitride semiconductor layer 340.

The ohmic junction layer 350 may be formed by depositing a metallic material including at least one of Ni, Ti, TiN, Pt, Au, $RuO_2$, V, W, WN, Hf, HfN, Mo, NiSi, $CoSi_2$, $WSi_x$, PtSi, Ir, Zr, Ta, TaN, Cu, Ru, and Co.

The first metallic junction layer 360 may be deposited using one of Au and Au—Sn based metallic materials, and a surface of the first metallic junction layer 360 may be coated with a metallic material including at least one of Cr, Ni, and Cu.

Figure 15:
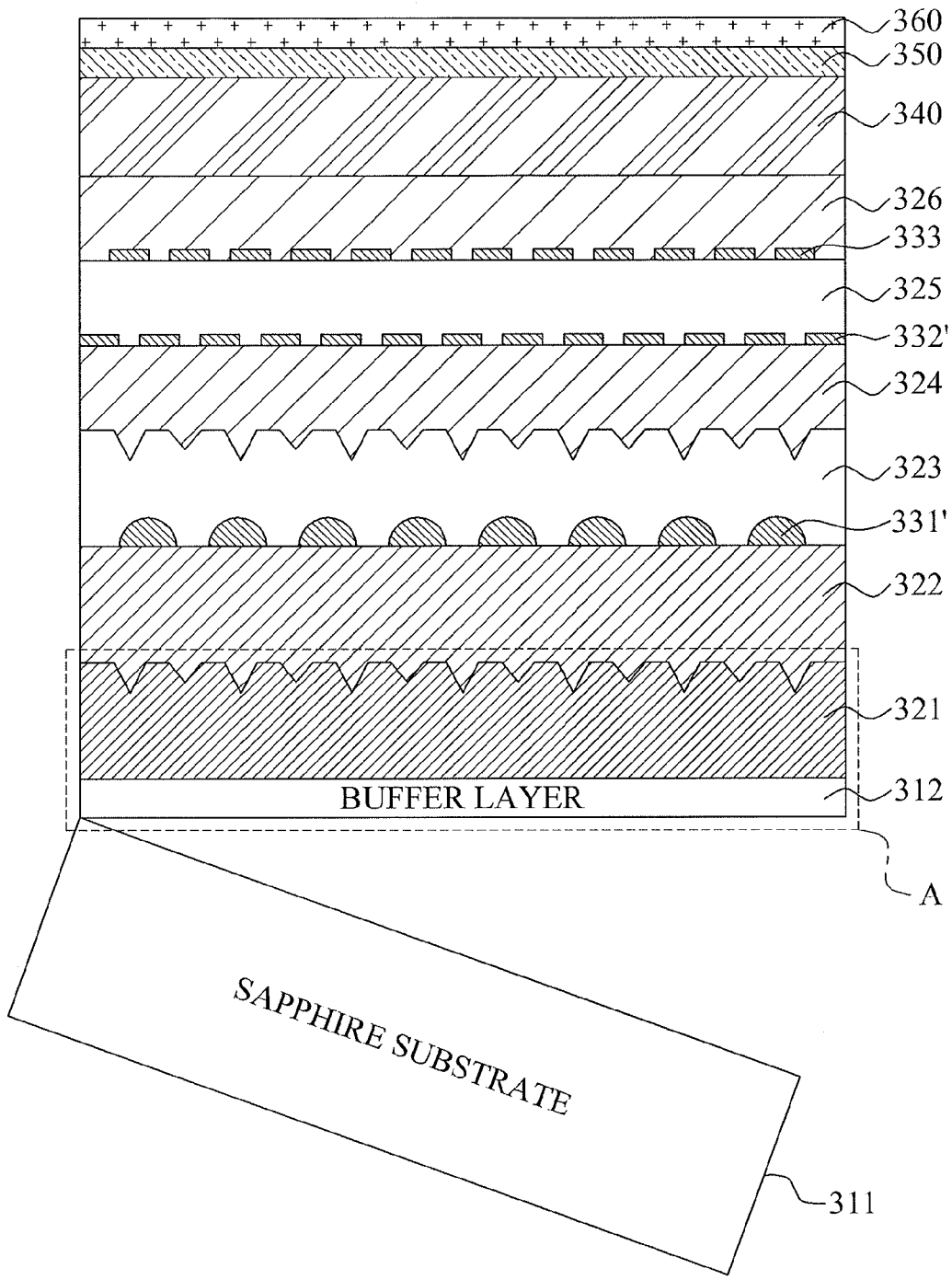

Referring to FIG. 15, the manufacturing method may include a processing of removing the sapphire substrate 311 using a lift-off operation, after the first metallic junction layer 360 is formed or before the first type group III nitride semiconductor layer 340 is deposited. In the process, the GaN semiconductor layer 321 may be exposed. By polishing a region A including the GaN semiconductor layer 321, the first group III nitride semiconductor layer 322 may be exposed.

Figure 16:
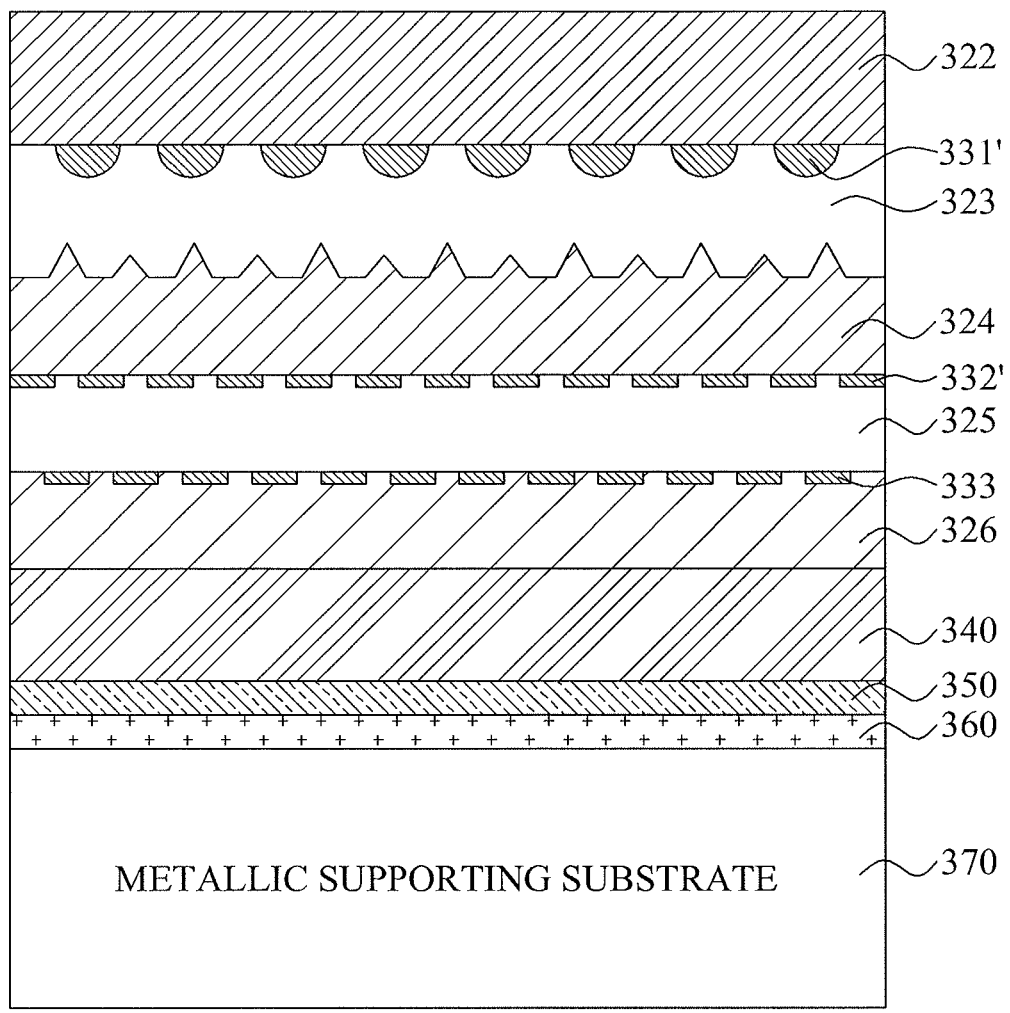

Referring to FIG. 16, the manufacturing method may include a process of bonding a metallic supporting substrate 370 on the first metallic junction layer 360. The metallic supporting substrate 370 may be a metallic substrate having a high thermal conductivity, for example, one of an Al—Si substrate, a Si substrate, an AlN substrate, a Cr substrate, a Ni substrate, and a Cu substrate. By separating the sapphire substrate 311 that is the growth substrate and supporting substrate of the semiconductor layer, and bonding the metallic supporting substrate 370, heat generated when the semiconductor device 300 is operated may be emitted rapidly.

Figure 17:
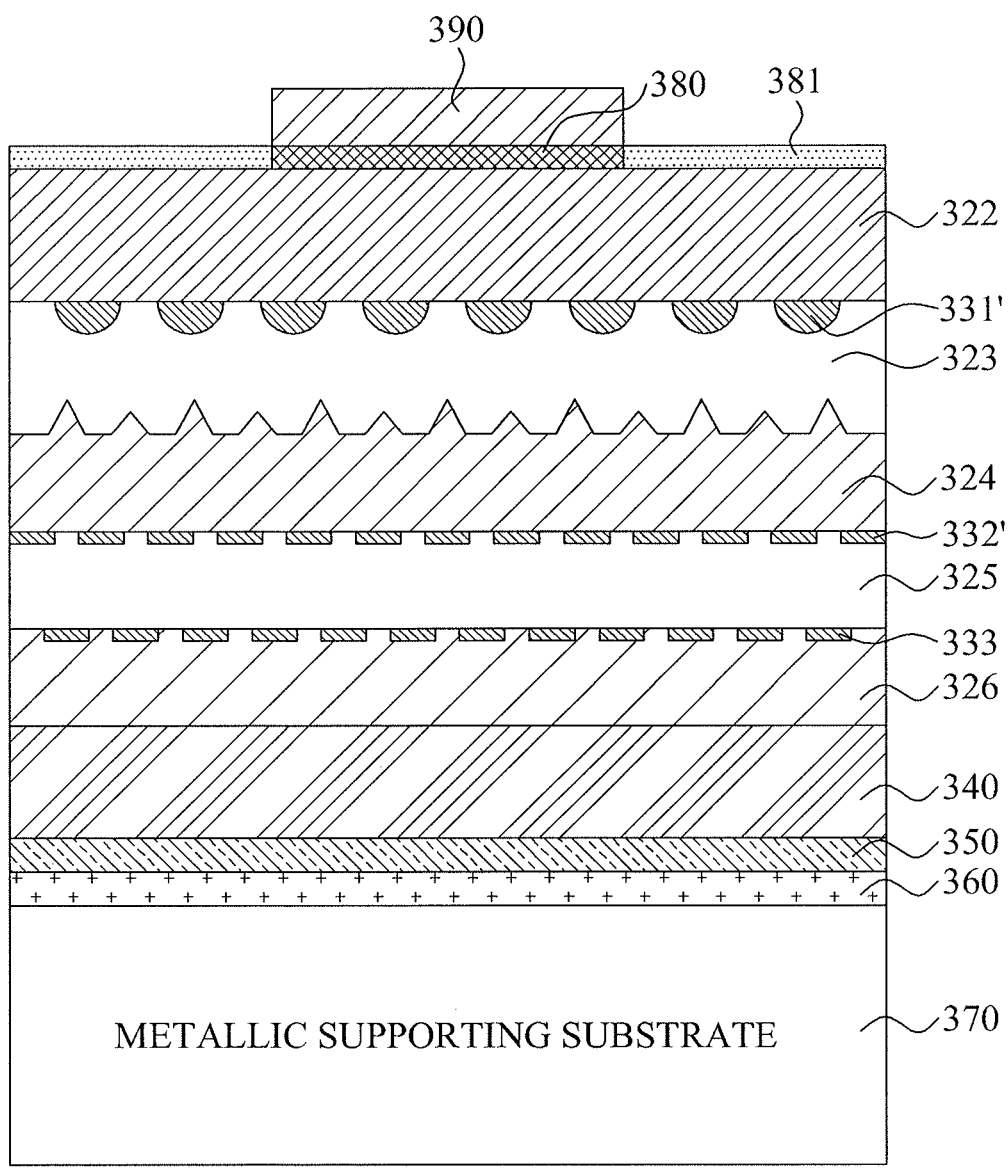

Referring to FIG. 17, the manufacturing method may include a process of forming a Schottky junction layer 380 and a second metallic junction layer 390 on the first group III nitride semiconductor layer 322. In particular, an insulating layer 381 including a hole may be formed on the first group III nitride semiconductor layer 322, and the Schottky junction layer 380 may be formed in the hole.

By forming the second metallic junction layer 390 on the Schottky junction layer 380, the semiconductor device 300 may be completed. The Schottky junction layer 380 may be formed of an identical or similar metallic material as is used for the ohmic junction layer 350, and the second metallic junction layer 390 may be formed of an identical or similar material as is used for the first metallic junction layer 360.

The manufacturing method described with reference to FIGS. 3 through 17 may be used to manufacture the semiconductor device 200 of FIG. 2. The semiconductor device 100 of FIG. 1 may also be manufactured using a similar method. In particular, using the method illustrated in FIGS. 3 through 6, the GaN semiconductor layer 321, the first group III nitride semiconductor layer 322, and the first insulating pattern layer 331' may be formed on the sapphire substrate 311, and a second group III nitride semiconductor layer (not shown) may be grown on the first insulating pattern layer 331'. In this instance, unlike the second group III nitride semiconductor layer 323 of FIG. 7, the second group III nitride semiconductor layer may have a flat surface without V-shaped groove patterns. The semiconductor device 100 of FIG. 1 may be manufactured on the second group III nitride semiconductor layer, by applying the method illustrated in FIGS. 14 through 17.

By way of summation and review, a nitride based semiconductor device may have various advantages, for example, a high breakdown field of about $3 \times 10^6$ volts per centimeter (V/cm), a maximum current density, a stable operation at a high temperature, a high thermal conductivity, and the like. Accordingly, the nitride based semiconductor device may have a high energy efficiency, and a high "response" for controlling a current flow, when compared to a typical silicon based semiconductor device. However, the nitride semiconductor device may have problems of high incidence of linear defects and low heat emitting efficiency since a sapphire substrate, having a low thermal conductivity and a lattice constant different from a lattice constant of the nitride based semiconductor, is generally used as a base substrate.

In contrast, embodiments may provide a nitride based semiconductor device and a manufacturing method thereof that may prevent linear defects and a leakage current, and may enhance a heat emitting efficiency. In particular, occurrences of linear defects may be prevented by growing a nitride based semiconductor layer to include V-shaped groove patterns, and growing an insulating layer to include curved protrusions.

In addition, embodiments may provide a nitride based semiconductor device and a manufacturing method thereof that may improve a thermal conductivity by removing a sapphire substrate corresponding to a growth substrate, and bonding a metallic supporting substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A nitride based semiconductor device, comprising:
   a first metallic junction layer;
   a Schottky junction layer on the first metallic junction layer;
   a first group III nitride semiconductor layer on the Schottky junction layer;
   a first insulating pattern layer on the first group III nitride semiconductor layer, the first insulating pattern layer including curved protrusions;
   a second group III nitride semiconductor layer laterally grown on the first group III nitride semiconductor layer that is exposed through the first insulating pattern layer, the second group III nitride semiconductor layer including V-shaped groove patterns on a surface;
   a third group III nitride semiconductor layer directly disposed on the second group III nitride semiconductor layer;
   a second insulating pattern layer on the third group III nitride semiconductor layer, the second insulating pattern layer including striped patterns;
   a fourth group III nitride semiconductor layer laterally grown on the third group III nitride semiconductor layer that is exposed through the second insulating pattern layer;
   a first type group III nitride semiconductor layer on the fourth group III nitride semiconductor layer, the first type group III nitride semiconductor layer being simultaneously doped with aluminum (Al) and silicon (Si);
   an ohmic junction layer on the first type group III nitride semiconductor layer;
   a second metallic junction layer on the ohmic junction layer; and
   a metallic supporting substrate on the second metallic junction layer.

2. The nitride based semiconductor device as claimed in claim 1, further comprising:
   a third insulating pattern layer on the fourth group III nitride semiconductor layer, the third insulating pattern layer including a plurality of patterns in a position corresponding to portions of the third group III nitride semiconductor layer that are exposed through the second insulating pattern layer; and
   a fifth group III nitride semiconductor layer laterally grown on the fourth group III nitride semiconductor layer that is exposed through the third insulating pattern layer.

3. The nitride based semiconductor device as claimed in claim 1, wherein the first metallic junction layer and the second metallic junction layer are made of one of gold and gold-tin based metallic materials.

4. The nitride based semiconductor device as claimed in claim 1, wherein the first metallic junction layer and the second metallic junction layer are coated with a metallic material including at least one of chromium (Cr), nickel (Ni), and copper (Cu).

5. The nitride based semiconductor device as claimed in claim 1, wherein the Schottky junction layer and the ohmic junction layer are made of a metallic material including at least one selected from Ni, titanium (Ti), titanium nitride (TiN), platinum (Pt), Au, ruthenium oxide (RuO$_2$), vanadium (V), tungsten (W), tungsten nitride (WN), hafnium (Hf), hafnium nitride (HfN), molybdenum (Mo), nickel silicide (NiSi), cobalt silicide (CoSi$_2$), tungsten silicide (WSi$_x$), platinum silicide (PtSi), iridium (Ir), zirconium (Zr), tantalum (Ta), tantalum nitride (TaN), Cu, ruthenium (Ru), and cobalt (Co).

6. The nitride based semiconductor device as claimed in claim 1, wherein the metallic supporting substrate is one selected from an aluminum-silicon (Al—Si) substrate, a Si substrate, an aluminum nitride (AlN) substrate, a Cr substrate, a Ni substrate, and a Cu substrate.

* * * * *